(12) United States Patent
Liu et al.

(10) Patent No.: US 9,580,672 B2
(45) Date of Patent: Feb. 28, 2017

(54) CLEANING COMPOSITION AND METHOD FOR SEMICONDUCTOR DEVICE FABRICATION

(71) Applicant: TAIWAN SEMICONDUCTOR MANUFACTURING COMPANY, LTD., Hsin-Chu (TW)

(72) Inventors: Chen-Yu Liu, Kaohsiung (TW); Ching-Yu Chang, Yilang County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 97 days.

(21) Appl. No.: 14/498,389

(22) Filed: Sep. 26, 2014

(65) Prior Publication Data

US 2016/0090565 A1    Mar. 31, 2016

(51) Int. Cl.
| | | |
|---|---|---|
| C11D 7/50 | (2006.01) | |
| C11D 11/00 | (2006.01) | |
| C11D 3/04 | (2006.01) | |
| C11D 3/20 | (2006.01) | |
| C11D 7/32 | (2006.01) | |

(52) U.S. Cl.
CPC .......... *C11D 11/0041* (2013.01); *C11D 3/046* (2013.01); *C11D 3/2093* (2013.01); *C11D 7/3209* (2013.01); *C11D 7/5022* (2013.01); *C11D 11/0047* (2013.01)

(58) Field of Classification Search
CPC .................................................. C11D 11/0047
See application file for complete search history.

(56) References Cited

U.S. PATENT DOCUMENTS

| 6,652,665 B1 * | 11/2003 | Sachdev | B08B 3/02 134/19 |
|---|---|---|---|
| 2006/0287207 A1 * | 12/2006 | Park | C11D 11/0047 510/175 |
| 2006/0293208 A1 * | 12/2006 | Egbe | C11D 7/3263 510/407 |
| 2008/0039356 A1 * | 2/2008 | Palmer | C11D 7/3209 510/424 |
| 2008/0096785 A1 * | 4/2008 | Egbe | C11D 7/261 510/176 |
| 2008/0163893 A1 * | 7/2008 | Quillen | C11D 3/2017 134/2 |

(Continued)

*Primary Examiner* — Gregory Webb
(74) *Attorney, Agent, or Firm* — Haynes and Boone, LLP

(57) ABSTRACT

Provided is a cleaning composition and its applications. The cleaning composition comprises a mixture of a halogen-containing compound and an organic solvent. In some embodiments, the halogen-containing compound is Tetra-ButylAmmonium Fluoride (TBAF) and the organic solvent is either propylene glycol monomethylether acetate (PG-MEA) or a mixture of PGMEA and propylene glycol monomethylether (PGME). The cleaning composition is effective in removing silicon-containing material off of a surface of an apparatus. In some embodiments, the apparatus comprises a pipeline for delivering the silicon-containing material in semiconductor spin-coating processes. In some embodiments, the apparatus comprises a drain for collecting waste fluid in semiconductor spin-coating processes. In some embodiments, the apparatus comprises a patterned substrate.

20 Claims, 9 Drawing Sheets

(56) References Cited

U.S. PATENT DOCUMENTS

| | | | |
|---|---|---|---|
| 2010/0009885 A1* | 1/2010 | Park | C11D 11/0047 |
| | | | 510/176 |
| 2013/0037921 A1* | 2/2013 | Han | C08L 83/06 |
| | | | 257/635 |
| 2013/0296214 A1* | 11/2013 | Barnes | H01L 21/02063 |
| | | | 510/176 |

* cited by examiner

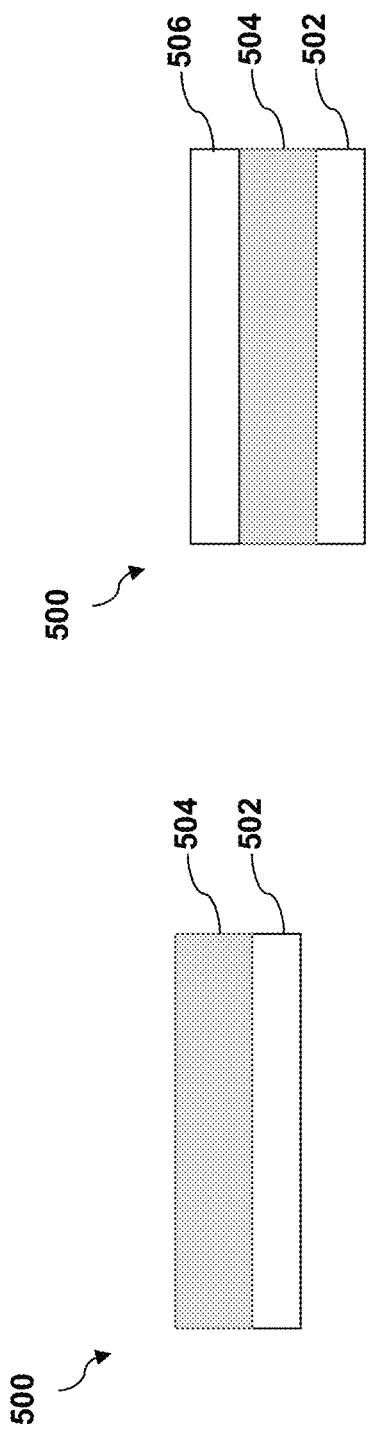
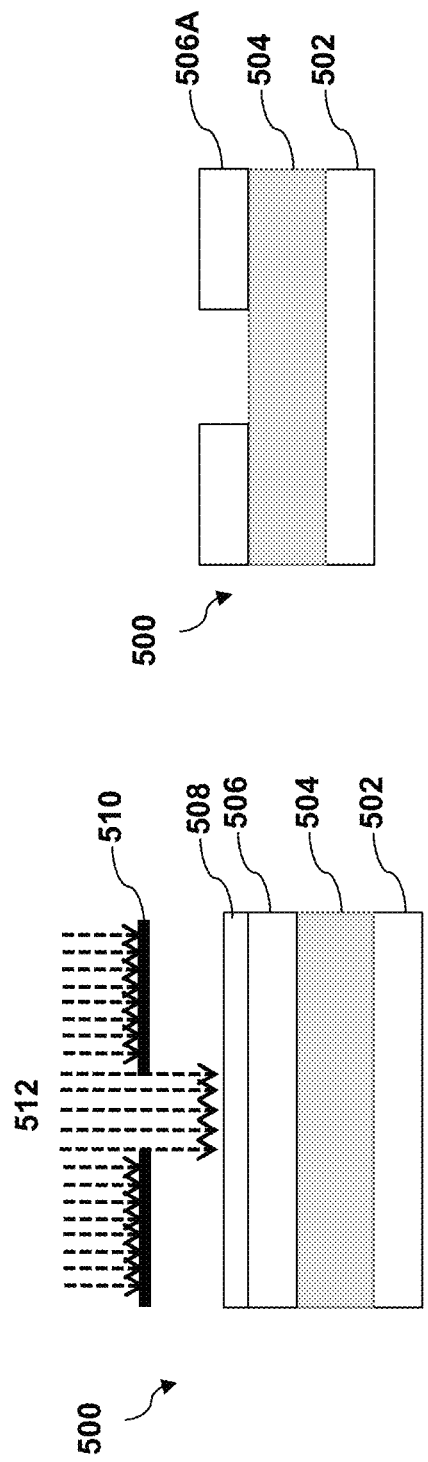
FIG. 5A
FIG. 5B
FIG. 5C
FIG. 5D

CLEANING COMPOSITION AND METHOD FOR SEMICONDUCTOR DEVICE FABRICATION

BACKGROUND

Photolithography (or lithography) is frequently used in manufacturing semiconductor integrated circuits (IC). In a typical lithography process, a resist film is spin-coated on a surface of a silicon wafer and is subsequently exposed and developed to form a pattern for etching the silicon wafer. As semiconductor fabrication technology continues to scale down where functional density has generally increased while geometry size has generally decreased, there has been a demand for a reduction in resist film thickness and a better reflectivity control during exposure. Accordingly, some new material and/or new techniques in lithography have been developed. For example, some lithography processes use silicon-containing resist over a carbon-containing bottom anti-reflective coating (BARC) layer to reduce resist film thickness. For another example, some lithography processes use a tri-layer stack that includes a resist over a silicon-containing BARC layer over a carbon-containing BARC layer. However, these approaches present new challenges.

For example, in the tri-layer approach, the silicon-containing material is intrinsically unstable and easily gels by forming crosslinks therein. The equipment that handles the material must undergo frequent cleaning processes to avoid being clogged. Unfortunately, the existing cleaning compositions are not effective in removing the cross-linked silicon-containing material. This unavoidably reduces lithography productivity. Accordingly, an improved cleaning composition and cleaning processes are needed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 5A-5G illustrate a substrate at various stages of the semiconductor manufacturing process of FIGS. 4A and 4B, in accordance with some embodiments.

DETAILED DESCRIPTION

Figure 1:
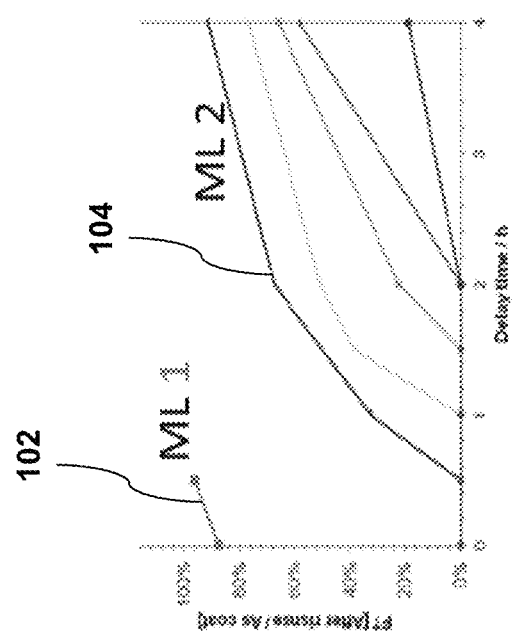
FIG. 1 illustrates ineffectiveness of using existing cleaning solutions to remove silicon-containing hard mask material.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to cleaning solution compositions and their applications. The cleaning solution can be used to clean semiconductor fabrication equipment, especially the apparatuses for delivering, dispensing, and collecting silicon-containing material in lithography spin-coating processes. The cleaning solution can also be used to remove a silicon-containing hard mask after the hard mask has been used in etching processes.

Silicon-containing BARC materials have been used in lithography processes in an effort to reduce resist film thickness. In a typical lithography patterning process, a resist layer is formed over a hard mask layer and is patterned with an IC design layout. An etching process is subsequently followed, which etches the hard mask layer using the patterned resist layer as an etch mask thereby transferring the pattern to the hard mask layer. Further steps are performed to transfer the pattern to a substrate. As semiconductor fabrication technologies continue to scale down, the resist pattern has become narrower and taller. Such high aspect ratio causes the resist pattern to collapse easily. Silicon-containing materials are developed to solve this problem. One approach uses silicon-containing resist which has higher etch resistance than regular resists and therefore needs not be as thick. Another approach, commonly known as tri-layer lithography, forms a thin resist layer over a silicon-containing BARC (or hard mask) layer which is in turn formed over an underlying BARC layer. The resist layer is used for patterning the silicon-containing hard mask layer which is then used for patterning layers underneath. All three layers are formed with spin-coating processes which are cheaper compared to, e.g., deposition processes. Among other things, both the silicon-containing resist layer approach and the tri-layer approach take advantage of high density of these silicon-containing materials, which is a result of cross-linking capability of their monomers and molecules. For example, the monomers below form cross links among neighboring molecules when solvents of the silicon-containing materials dry out.

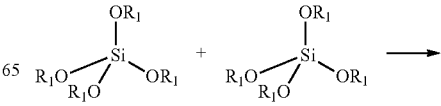

-continued

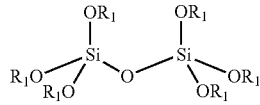

However, the same property that makes these materials desirable for the lithography processes also presents a challenge to lithography equipment handling these materials. These include containers that store the materials, pipelines and delivery apparatuses that deliver the materials in liquid form in spin-coating processes, and collection apparatuses that collect waste materials in the spin-coating processes. As shown in FIG. 1, two typical silicon-containing hard mask materials, ML1 and ML2, once forming a layer on the surfaces of the lithography equipment, become difficult to remove with the traditional cleaning solvents, such as OK73 (70% Propylene glycol monomethylether+30% Propylene glycol monomethylether acetate). The curve 102 shows that the ML1 material layer will retain over 80% of its thickness as deposited even if OK73is immediately applied and will become nearly impossible to remove by OK73after about half an hour delay. The curve 104 shows that the ML2 material layer is easier to remove than the ML1 material layer, but becomes increasingly difficult to remove by OK73as time passes. Consequently, the lithography equipment handling these materials may become clogged as the materials harden. Furthermore, the material may form large particles that contaminate wafers during various processing stages.

It is therefore an objective of the present disclosure to design new cleaning compositions that can effectively remove such materials from lithography equipment.

Figure 2A:
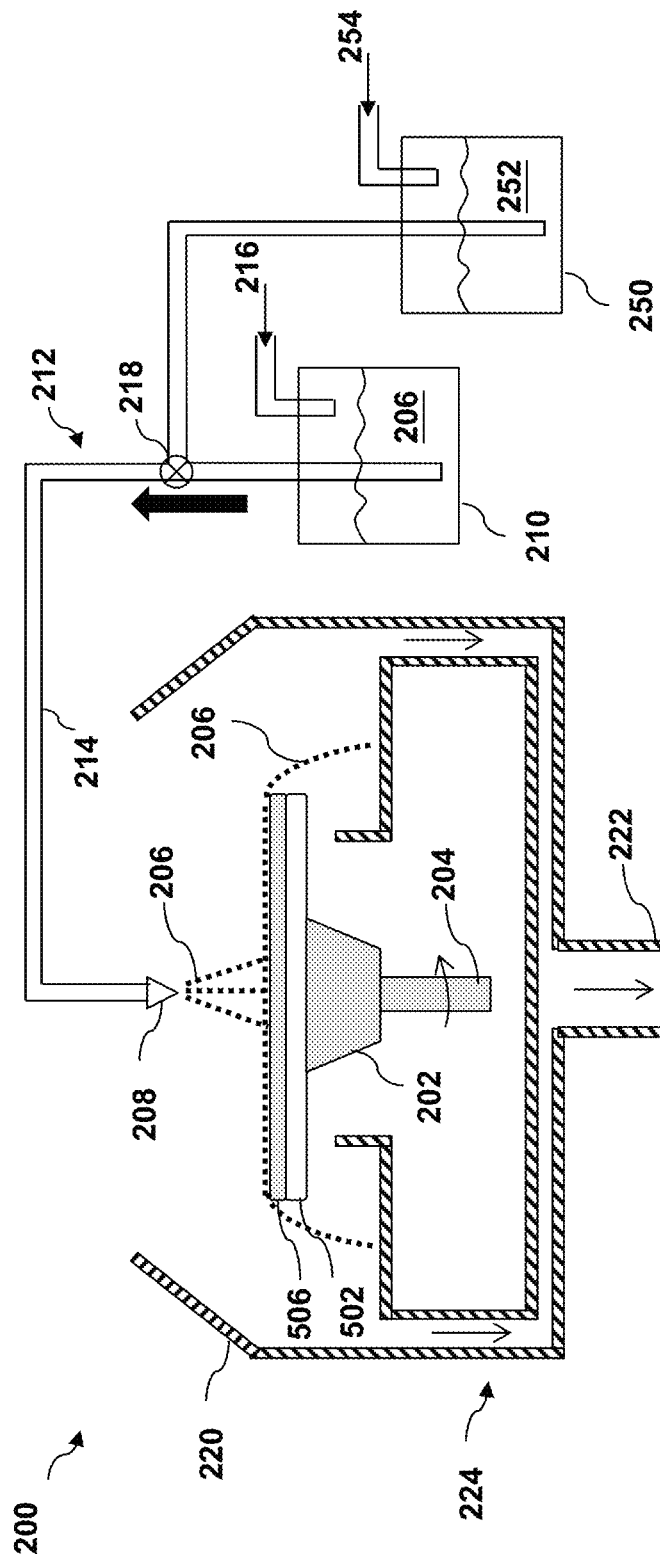
FIG. 2A illustrates a semiconductor fabrication system that may benefit from various aspects of the present disclosure.

Now, referring to FIG. 2A, shown therein is a semiconductor spin-coating system 200 that may benefit from various aspects of the present disclosure. As shown, the system 200 includes a substrate stage 202 designed to retain a substrate 502 to be patterned. The substrate 502 is coated with a silicon-containing material layer 506 as part of a tri-layer lithography stack. The substrate stage 202 is operable to spin such that the substrate 502 secured thereon is spun accordingly during the spin-coating process. The substrate stage 202 includes a mechanism, such as vacuum suction mechanism, e-chucking, or other suitable mechanism, to secure the substrate 502. In the present embodiments, the substrate 502 is a semiconductor wafer, such as a silicon wafer. In some embodiments, the substrate 502 is a wafer having other semiconductor material, such as silicon germanium layer epitaxy grown on a silicon wafer or a compound semiconductor layer epitaxy grown on a sapphire wafer. In some embodiments, the substrate 502 may include other suitable substrate to be patterned by the lithography patterning.

The system 200 further includes a motion mechanism 204 integrated with the substrate stage 202 and is operable to drive the substrate stage 202 and the substrate 502 secured thereon in various motion modes. In some embodiments, the motion mechanism 204 includes a motor to drive the substrate stage 202 and the substrate 502 to spin at a certain spin speed during various operations (such as coating and rinsing). In some embodiments, the motion mechanism 204 includes an elevation module to move the substrate 502 along a vertical direction so that the substrate 502 is able to be positioned at a lower or higher level.

A silicon-containing liquid 206 is dispensed through a nozzle 208 over the substrate 502 while it is spun. As solvents in the liquid 206 dry out, it forms the silicon-containing material layer 506. The silicon-containing liquid 206 is stored in a container 210 and is delivered to the nozzle 208 through a delivery apparatus 212 that includes a pipeline 214. In the embodiment as shown, a pressurized gas 216, such as nitrogen, may be introduced into the container 210 to force the liquid 206 into the delivery apparatus 212. The system 200 further includes a container 250 that holds a cleaning solution 252 which will be described in more details below. In the embodiment as shown, a pressurized gas 254, such as nitrogen, may be introduced into the container 250 to force the cleaning solution 252 into the delivery apparatus 212. The delivery apparatus 212 includes a three-way valve 218 that directs the silicon-containing liquid 206 to the pipeline 214 during spin-coating cycles and directs the cleaning solution 252 to the pipeline 214 during cleaning cycles. As shown in FIG. 2A, the three-way valve 218 is configured to allow the liquid 206 being delivered through the delivery apparatus 212. In various embodiments, the delivery apparatus 212 may alternatively use pumps or other mechanism in delivering the liquid 206 and the cleaning solution 252.

The system 200 further includes a waste collection apparatus 224 that includes a cup 220 and a drain 222. The cup 220 is configured around the substrate stage 202 to effectively catch the liquid 206 spun off from the substrate 502 during the spin-coating process. In some embodiments, the cup 220 is designed to have a cylindrical structure. The cup 220 is integrated with the drain 222 such that the liquid received from the cup is sent out through the drain 222 for further processing.

Figure 2B:
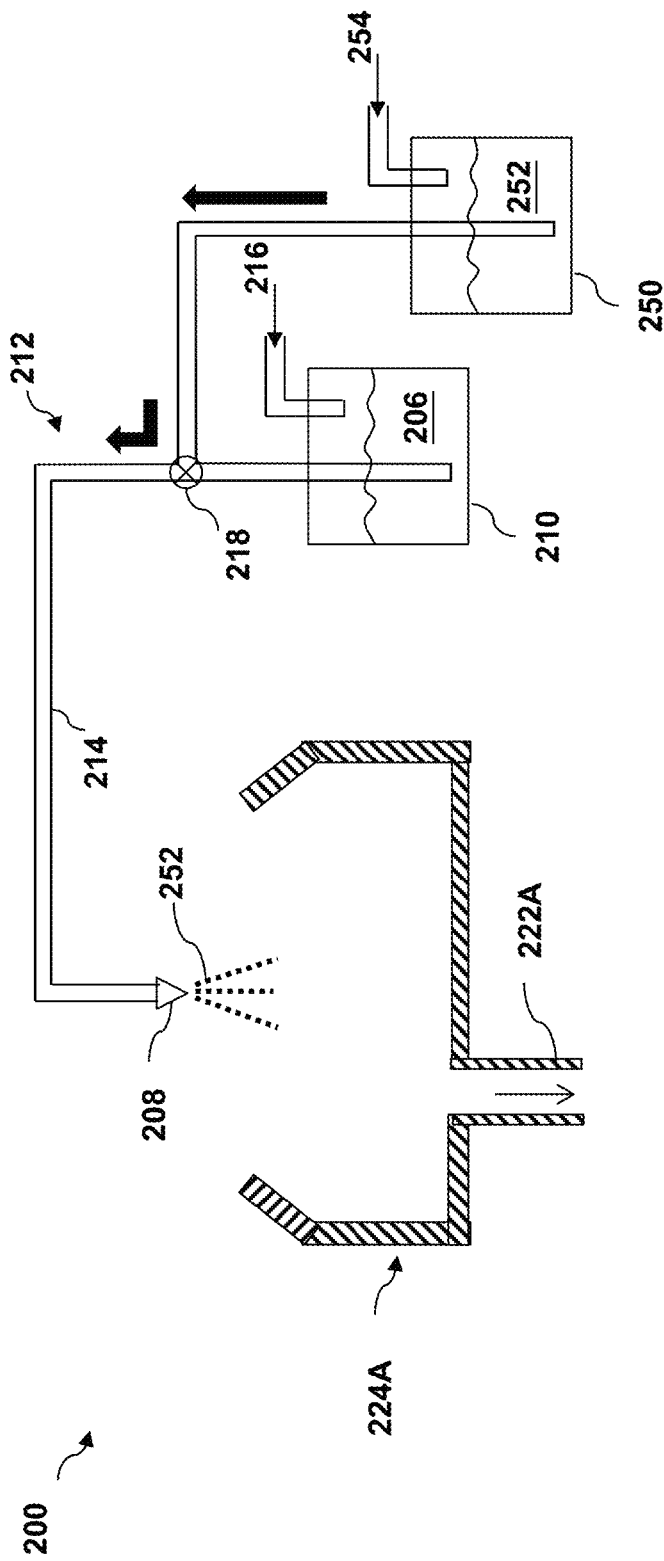
FIGS. 2B and 2C illustrate components of the system of FIG. 2A being cleaned by a chemical solution constructed according to various aspects of the present disclosure.
Figure 2C:
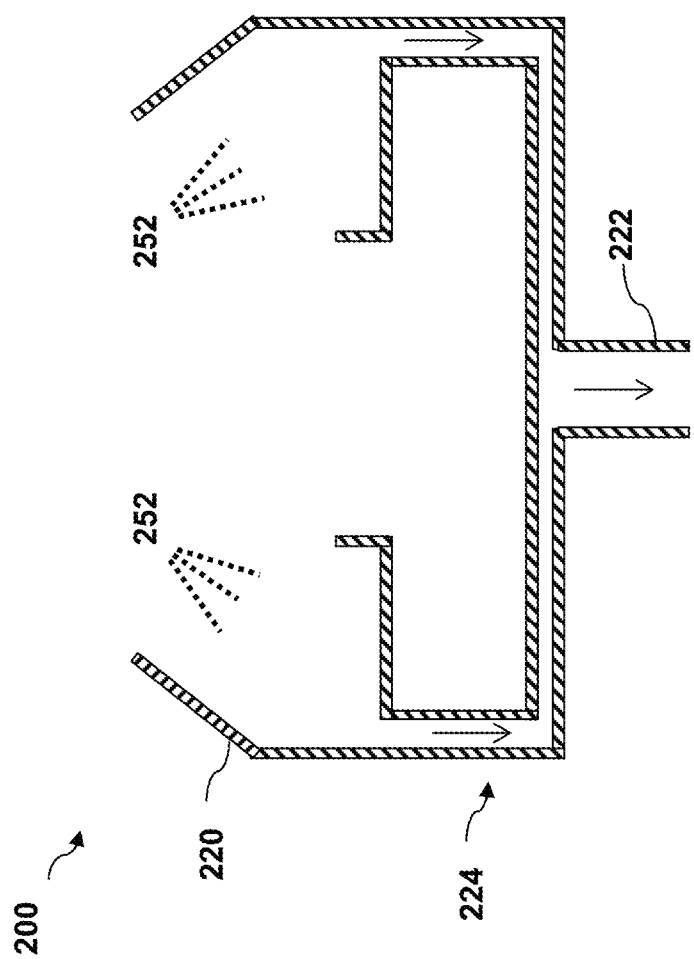

As described above, the various components of the delivery apparatus 212 and the waste collection apparatus 224 could be clogged by the silicon-containing material 206 as it deposits onto the surfaces of the various components. Hence, the system 200 periodically undergoes cleaning cycles to remove such deposits. FIG. 2B illustrates some components of the system 200 being cleaned in one such cleaning cycle. Referring to FIG. 2B, the substrate 502 including the silicon-containing material layer 506 has been removed to further processing stages, such as exposing and developing, which are not illustrated here. The nozzle 208 has been repositioned to direct any fluid to a waste collection apparatus 224A including a drain 222A. Further, the three-way valve 218 is configured to switch off the liquid 206 and switch on the cleaning solution 252. The pressurized gas 254, such as nitrogen, is introduced to the container 250 to force the cleaning solution 252 into the delivery apparatus 212. The cleaning solution 252 flushes the delivery apparatus 212 including the pipeline 214 and the nozzle 208, and any waste is collected by the waste collection apparatus 224A and is sent out through the drain 222A. It is noted that the various components are cleaned without being taken out of the spin-coating system 200, thereby reducing the system's off-line time. FIG. 2C illustrates an embodiment of a method of cleaning the waste collection apparatus 224. In the embodiment as shown, the cleaning solution 252 is sprayed onto the inner surfaces of the cup 220 and any waste is collected into the drain 222.

Figure 3:
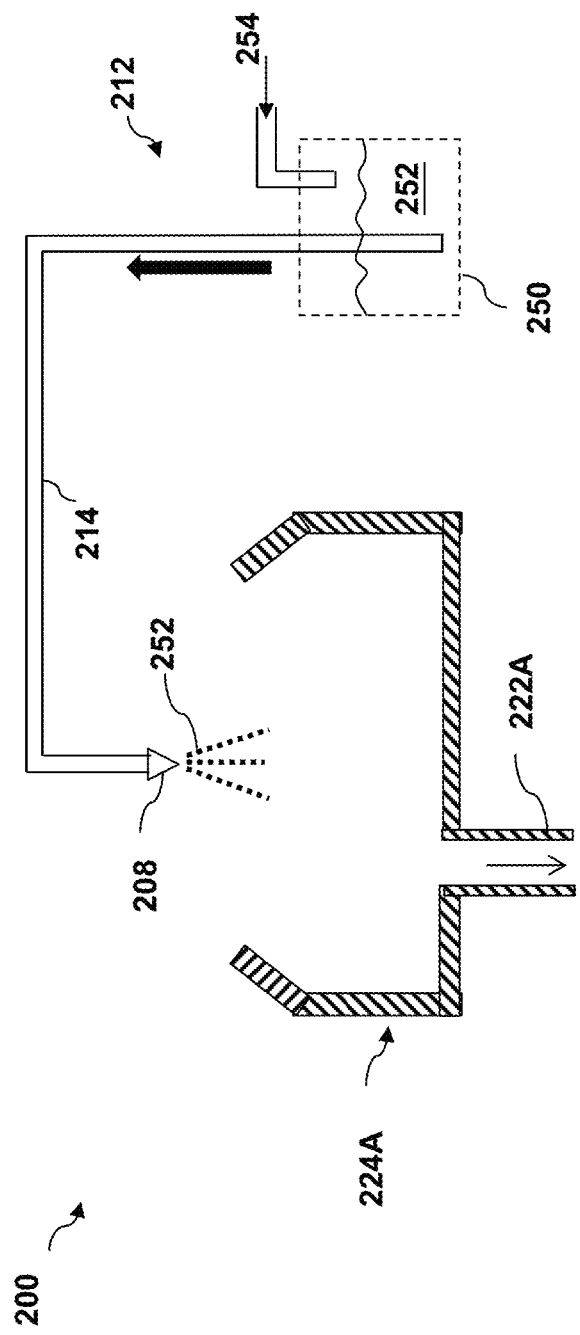
FIG. 3 illustrates alternative methods of cleaning some components of the system of FIG. 2A according to various aspects of the present disclosure

FIG. 3 shows an alternative embodiment of the delivery apparatus 212 and the cleaning thereof. Referring to FIG. 3, the delivery apparatus 212 does not use a three-way valve. Instead, the containers 210 and 250 are switchable and are selectively installed. For example, during spin-coating cycles, the container 210 is used; during cleaning cycles, the container 250 replaces the container 210. This simplifies the delivery apparatus 212 and makes it easier to clean.

Other embodiments of applying the cleaning solution 252 are possible. For example, instead of using pressurized gas, a pump can be used to extract the cleaning solution 252 from the container 250 into the delivery apparatus 212.

In various embodiments, the cleaning solution 252 is a mixture of a halogen-containing compound and a solvent. The halogen-containing compound is dissolved into the solvent, resulting in rich halide ions in the cleaning solution 252. Some Si-halogen bonds, such as Si—F bonds, have higher energy than Si—O bond. Therefore, the halide ions can be used to break down Si—O bonds, effectively dissolving oxidized silicon-containing material. Table 1 shows a comparison of bond energy among various chemical bonds.

TABLE 1

Comparison of bond energies

| Bond | $\overline{D}$(Si—X) | Bond | D(Si—X) | Bond | D(Si—X) | Bond | D(Si—X) |
|---|---|---|---|---|---|---|---|
| Si—Si | 54 | $H_3Si$—F | 152 | $Me_3Si$—F | 158 | $F_3Si$—F | 167 |
| Si—C | 76 | $H_3Si$—Cl | 109 | $Me_3Si$—Cl | 117 | $Cl_3Si$—Cl | 110 |
| Si—Cl | 95 | $H_3Si$—Br | 90 | $Me_3Si$—Br | 102 | $Br_3Si$—Br | 90 |
| Si—O | 111 | $H_3Si$—I | 71 | $Me_3Si$—I | 82 | $I_3Si$—I | 68 |

As shown in Table 1, Si—F bonds are particularly strong, which can be used to design various embodiments of the cleaning solution 252.

In an embodiment, the halogen-containing compound is Tetrabutylammonium fluoride (TBAF) and the solvent is an organic solvent that contains 70% by weight Propylene glycol monomethylether (PGME) and 30% by weight Propylene glycol monomethylether acetate (PGMEA), such as the solvent OK73. To further this embodiment, the cleaning solution 252 is rich in fluoride ($F^-$) anions that are effective in attacking the cross-links formed between silicon and oxygen as follows:

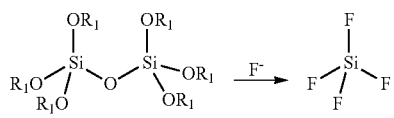

In various applications, the cleaning solution 252 can be used to dissolve hardened silicon-containing material 206 and remove it from the surfaces of the delivery apparatus 212 and the waste collection apparatus 224. In another embodiment, the cleaning solution 252 may contain rich chlorine ($Cl^-$) anions which can also dissolve hardened silicon-containing material 206. In yet another embodiment, the cleaning solution 252 is a mixture of TBAF and the solvent PGMEA.

In an embodiment, the cleaning solution 252 contains about 0.01% to about 70% by weight TBAF and the remainder is a solvent such as OK73 or PGMEA. In another embodiment, the cleaning solution 252 contains about 0.01% to about 20% by weight TBAF and greater than 50% by weight a solvent such as OK73 or PGMEA. Other chemicals, such as surfactants and/or additives, may be added to adjust the pH value and viscosity of the cleaning solution 252. In yet another embodiment, the cleaning solution 252 contains about 0.1% to about 2% by weight TBAF and greater than 50% by weight the solvent such as PGMEA or OK73.

Table 2 below shows the effectiveness of various embodiments of the cleaning solution 252 in removing the silicon-containing material 206 from a surface of an apparatus. In these embodiments, the halogen-containing compound is TBAF and the solvent is OK73. In the experiments, a film is formed by spin-coating the silicon-containing material 206 over a substrate and letting it dry out at room temperature. Then the substrate including the film is submerged into a container holding an embodiment of the cleaning solution 252 for ten (10) minutes. The thickness of the film is measured before and after the experiment so that an etch rate by the embodiment of the cleaning solution 252 can be calculated.

TABLE 2

Comparison of Etch Rates

| | TBAF % in OK73 | | | | |
|---|---|---|---|---|---|
| | 0.1 | 0.2 | 0.3 | 0.4 | 0.5 |
| Film      T = 0 | 366.87 | 360.58 | 358.17 | 361.14 | 359.4 |
| Thickness T = 10 minutes | 285.47 | 240.38 | 210.14 | 188.16 | 302.9 |
| Film Loss (Å) | 81.40 | 120.20 | 148.03 | 172.98 | 56.50 |
| Etch Rate (Å/min) | 8.14 | 12.02 | 14.80 | 17.30 | 5.65 |

Table 3 below compares etch rate of various embodiments of the cleaning solution 252 when applied to baked and non-baked films of silicon-containing material 206. Understandably, the baked films contain higher density of molecular cross links and therefore are generally more difficult to etch. In the experiments, the solvent is PGMEA or OK73 and the halogen-containing compound is TBAF.

TABLE 3

Comparison of Etch Rates

| | | TBAF % in PGMEA | | | | TBAF % in OK73 | | | |
|---|---|---|---|---|---|---|---|---|---|
| | | 0.1 | 0.5 | 1.0 | 2.0 | 0.1 | 0.5 | 1.0 | 2.0 |
| Etch Rate (Å/min) | Baked | 0.399 | 0.438 | 0.456 | 0.37 | 1.599 | 6.172 | 4.636 | 3.328 |
| | Non-Baked | 1.02 | 2.02 | 3.4 | 0.67 | 8.14 | 5.65 | 5.13 | 2.4 |

As can be seen from the Tables 2 and 3, the various embodiments of the cleaning solution 252 are very effective in removing particles or hardened layers of the silicon-containing material 206. It has also been found that even when the silicon contents are high in the to-be-removed layer, such as 10% or more by weight silicon, the cleaning solution 252 is still very effective while the traditional thinners such as OK73 have lost their effectiveness. Further, although the exact mechanism is yet to be learned, a higher concentration of TBAF in the cleaning solution 252 does not always yield a higher etch rate, as shown in Table 2 (comparing TBAF concentration of 0.5% and 0.4%).

Figure 4A:
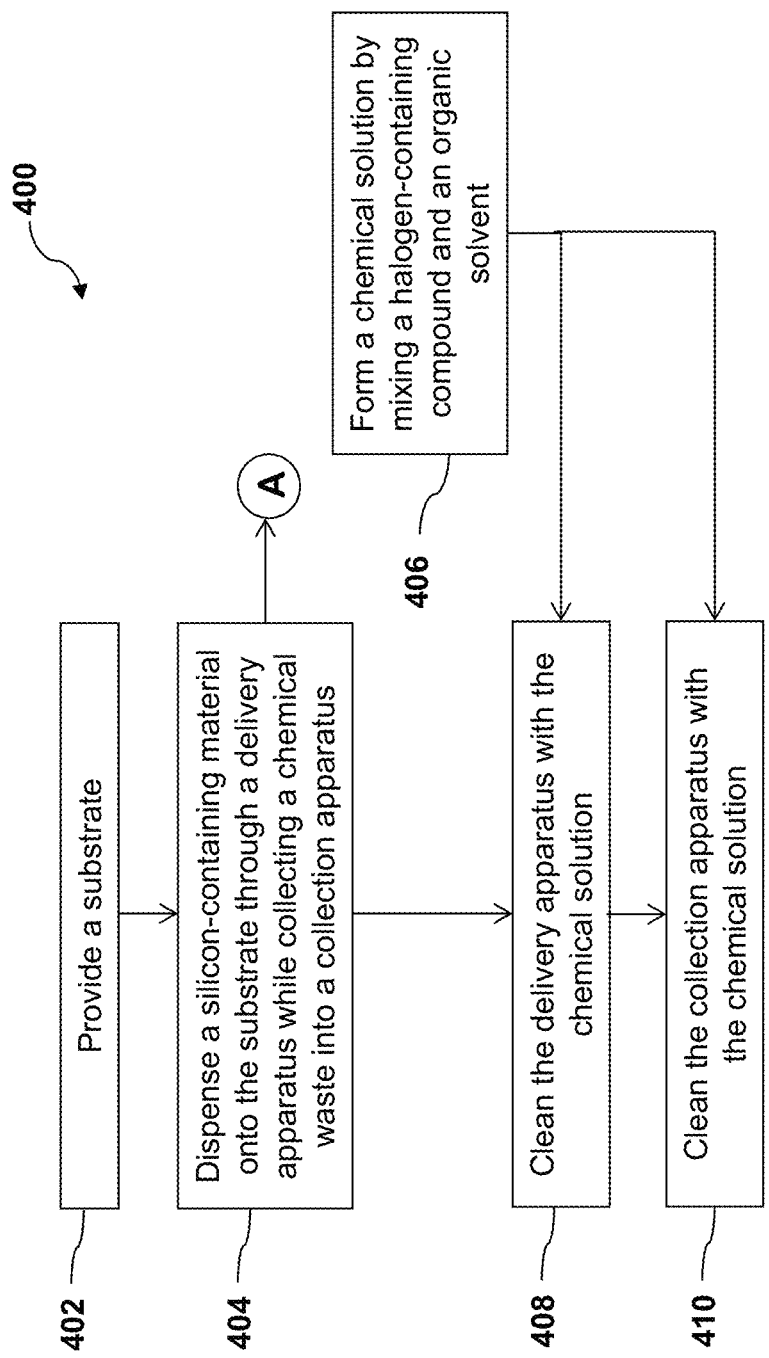
FIGS. 4A and 4B show a flow chart of a semiconductor manufacturing process, constructed in accordance with some embodiments.
Figure 4B:
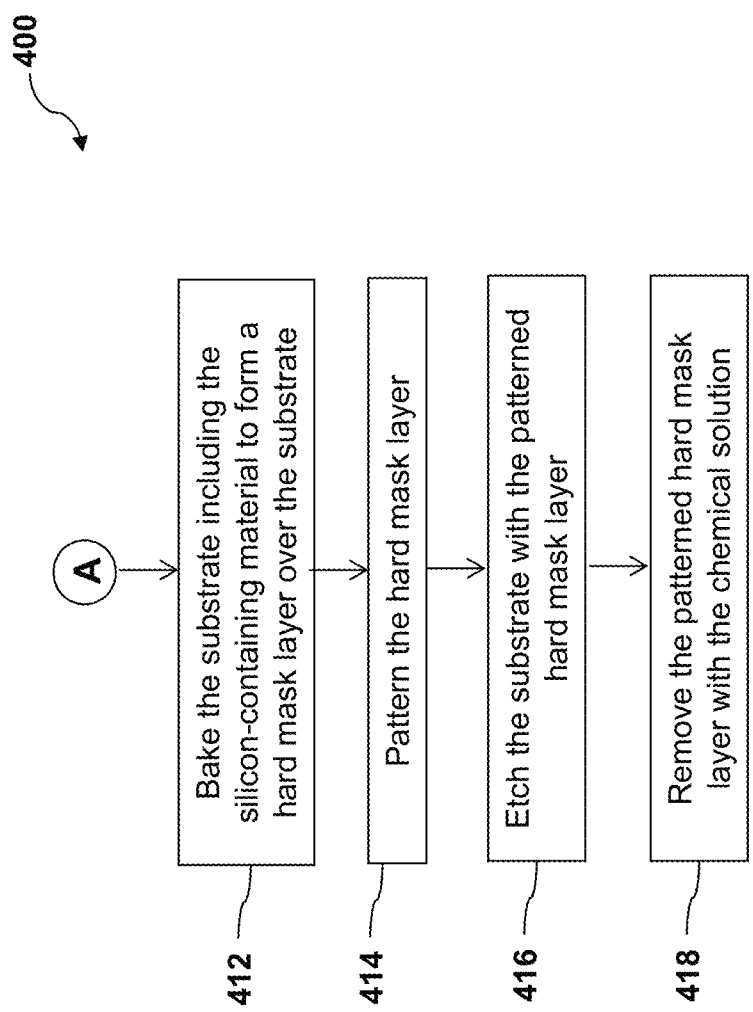

FIGS. 4A and 4B show a flow chart of a semiconductor manufacturing process 400, illustrating some exemplary applications of various embodiments of the cleaning solution 252. It is noted that these are merely examples and do not limit where and how the cleaning solution 252 is used. Additional operations can be provided before, during, and after the process 400, and some operations described can be replaced, eliminated, or moved around for additional embodiments of the method. The process 400 is an example, and is not intended to limit the present disclosure beyond what is explicitly recited in the claims. The process 400 will be further described below in conjunction with FIGS. 2A-2C, 3, and 5A-5G.

Referring to FIG. 4A, at operation 402, the process 400 is provided with a substrate, such as the substrate 502, in manufacturing a semiconductor device 500. Referring to FIG. 5A, in an embodiment, the substrate 502 is a semiconductor substrate (e.g., wafer). In an embodiment, the substrate 502 includes silicon in a crystalline structure. In alternative embodiments, the substrate 502 includes other elementary semiconductors such as germanium, or a compound semiconductor such as silicon carbide, gallium arsenide, indium arsenide, and indium phosphide. The substrate 502 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers. Also shown in FIG. 5A, the device 500 further includes a BARC layer 504 over the substrate 502 as the bottom layer of a tri-layer lithographic stack. In an embodiment, the BARC layer 504 is formed using a spin-coating process illustrated in FIG. 2A, followed by a baking process.

The process 400 (FIG. 4A) proceeds to operation 404 to dispense a silicon-containing material layer 506 over the BARC layer 504. In an embodiment, the dispensing of the silicon-containing material 206 comprises a spin-coating process such as illustrated in FIG. 2A. To further this embodiment, the silicon-containing material 206 is delivered through a delivery apparatus 212 including a pipeline 214 and is dispensed onto the device 500 through a nozzle 208 (FIG. 2A). The device 500 including the substrate 504 and the BARC layer 504 is secured on a substrate stage 202 and is spun at certain speed while the silicon-containing material 206 is dispensed. A thickness of the layer 506 may be controlled by the spin speed, the dispensing flow rate, the time for the dispensing, and other factors. In an embodiment, operation 404 further includes collecting a chemical waste derived from the silicon-containing material 206 into a collection apparatus 224 which includes a collection cup 220 and a drain 222 (FIG. 2A).

The process 400 (FIG. 4A) proceeds to operation 406 by forming a chemical solution 252. In an embodiment, the chemical solution 252 is formed by mixing a halogen-containing compound with a solvent, such as an organic solvent. In an embodiment, the halogen-containing compound is TBAF and the solvent is OK73. To further this embodiment, the chemical solution 252 contains about 0.1% to about 2% by weight TBAF and greater than 50% by weight OK73. In another embodiment, the halogen-containing compound is TBAF and the solvent consists essentially of PGMEA. To further this embodiment, the chemical solution 252 contains about 0.1% to about 2% by weight TBAF and greater than 50% by weight PGMEA. The chemical solution 252 is rich in halide anions, such as fluoride ($F^-$). Other embodiments of the chemical solution 252 are possible, as discussed above.

After the silicon-containing material layer 506 has been coated over the BARC layer 504, the device 500 is moved to other processing units for further processes. This will be discussed with respect to FIG. 4B. Meanwhile, the process 400 (FIG. 4A) proceeds to operation 408 to clean the delivery apparatus 212 and the waste collection apparatus 224 with the chemical solution 252. In an embodiment, this includes switching off the passage for the silicon-containing material 206 and switching on the passage for the chemical solution 252 as shown in FIG. 2B. In another embodiment, this includes replacing a container 210 that holds the silicon-containing material 206 with a container 250 that holds the chemical solution 252 as shown in FIG. 3. In various embodiments, the chemical solution 252 may be introduced to the delivery apparatus 212 via a pressurized gas, a pump, or other mechanism.

The process 400 (FIG. 4A) proceeds to operation 410 to clean the waste collection apparatuses, such as the collection cup 220 and the drain 222. In an embodiment, the waste collection apparatus 224 may be cleaned by directly spraying the chemical solution 252 thereon, as illustrated in FIG. 2C. Being rich in halide ions, the chemical solution 252 effectively removes solidified particles of the silicon-containing material 206 off of the surfaces of the delivery apparatus 212, the waste collection apparatus 224, and various other components of the system 200.

FIG. 4B shows further processing of the device 500 and more applications of the chemical solution 252. Referring to FIG. 4B, after the silicon-containing material layer 506 has been spin-coated over the BARC layer 504, the process 400 proceeds to operation 412 to bake the substrate 502 including the BARC layer 504 and the silicon-containing material layer 506. The baking operation may take place in another processing unit, separate from the spin-coating system 200. The baking operation drives solvent out of the silicon-containing material layer 506 and solidifies the material therein, making it a hard mask layer 506 (FIG. 5B) for subsequent etching processes.

The process 400 (FIG. 4B) proceeds to operation 414 to pattern the hard mask layer 506. This involves multiple steps, as illustrated in FIGS. 5C and 5D. Referring to FIG. 5C, in an embodiment, operation 414 includes coating a resist 508 over the hard mask layer 506; exposing the resist 508 to a radiation 512 through a mask (or photo-mask or reticle) 510; and developing the exposed resist 508 to form a resist pattern. The resist 508 may be a positive resist or a negative resist. A positive resist is normally insoluble in a resist developer, but is made soluble by exposure to the radiation. A negative resist has the opposite behavior. The mask 510 includes IC design layout patterns to be formed into the device 500. The radiation 512 may be a deep ultraviolet (DUV) ray, an extreme ultraviolet (EUV) ray, an electron beam (e-beam), or other suitable radiation. Referring to FIG. 5D, operation 414 further includes etching the hard mask layer 506 with the resist pattern as an etch mask and subsequently removing the resist pattern, resulting a patterned hard mask layer 506A over the BARC layer 504.

Figure 5E:
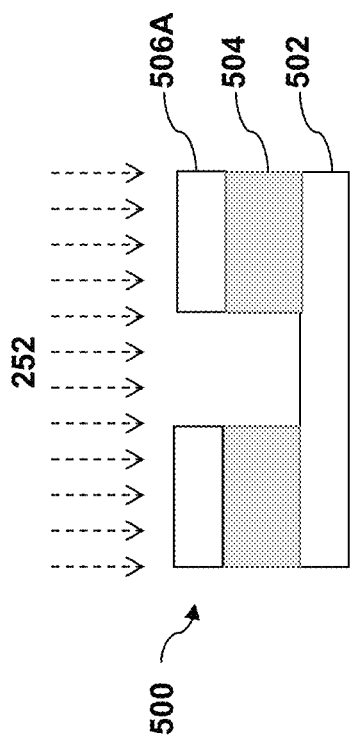

The process 400 (FIG. 4B) proceeds to operation 416 to etch the BARC layer 504 and/or the substrate 502 with the patterned hard mask layer 506A as an etch mask. Referring to FIG. 5E, the etching of the BARC layer 504 and/or the substrate 502 may be wet etching, dry (plasma) etching, or other suitable etching processes. For example, anisotropic dry etching may be used to etch the BARC layer 504 and/or the substrate 502 to minimize dimension variations in pattern transfer.

Figure 5F:
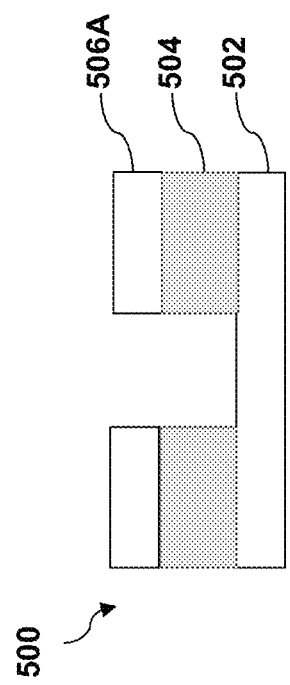
Figure 5G:
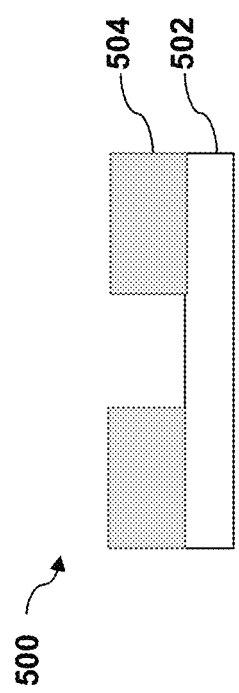

The process 400 (FIG. 4B) proceeds to operation 418 to remove the patterned hard mask layer 506A with the chemical solution 252. In the embodiment as shown in FIG. 5F, the chemical solution 252 is applied to the device 500 in a wet etching process. Due to various properties discussed above, the chemical solution 252 is effective in removing the patterned hard mask layer 506A off of the substrate 502 (FIG. 5G). Alternatively, the patterned hard mask layer 506A may be removed with a dry etching process.

The embodiments of the present disclosure offer advantages over existing art, though it is understood that other embodiments may offer different advantages, not all advantages are necessarily discussed herein, and that no particular advantage is required for all embodiments. By the disclosed cleaning solution composition and the methods of applying the same, the semiconductor spin-coating system can be cleaned effectively. Particularly, various apparatuses handling silicon-containing BARC materials can be cleaned without being taken out of the spin-coating system. In addition, spin-coating delivery apparatuses and waste collection apparatuses can be cleaned with the disclosed cleaning solution so that they don't get clogged. A clean spin-coating system also reduces contamination of wafers by particles of the silicon-containing BARC material.

In one exemplary aspect, the present disclosure is directed to a method for removing a silicon-containing material layer over a surface of an apparatus. The method includes forming a chemical solution by mixing a halogen-containing compound and an organic solvent and applying the chemical solution to the surface to remove the silicon-containing material layer. In various embodiments, the halogen-containing compound is Tetrabutylammonium fluoride (TBAF) and the organic solvent is either Propylene glycol monomethylether acetate (PGMEA) or a mixture of 30% by weight PGMEA and 70% by weight Propylene glycol monomethylether (PGME).

In another exemplary aspect, the present disclosure is directed to a method for removing a silicon-containing material layer over a surface of an apparatus. The method includes forming a chemical solution having halide anions in a mixture containing PGMEA and applying the chemical solution to the surface to remove the silicon-containing material layer.

In yet another exemplary aspect, the present disclosure is directed to a cleaning composition comprising a mixture of TBAF and PGMEA. In an embodiment, the cleaning composition further comprises PGME.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for removing a silicon-containing material layer over a surface of an apparatus comprising:
    forming a chemical solution by mixing 0.01% to 20% by weight Tetrabutylammonium fluoride (TBAF) and greater than 50% by weight an organic solvent, wherein the organic solvent contains about 30% by weight Propylene glycol monomethylether acetate (PGMEA) and about 70% by weight Propylene glycol monomethylether (PGME); and
    applying the chemical solution to the surface to remove the silicon-containing material layer.

2. The method of claim 1, wherein the chemical solution contains 0.1% to about 2% by weight TBAF.

3. The method of claim 1, wherein the chemical solution contains fluoride F⁻ anions.

4. The method of claim 1, wherein the silicon-containing material layer contains more than 10% by weight silicon.

5. The method of claim 1, wherein the apparatus comprises a pipeline for delivering the silicon-containing material in semiconductor photolithography.

6. The method of claim 1, wherein the apparatus comprises a drain for collecting waste fluid in semiconductor photolithography.

7. The method of claim 1, wherein the apparatus comprises a silicon wafer.

8. A method for removing a silicon-containing material layer over a surface of an apparatus comprising:
    forming a chemical solution having halide anions in a mixture containing about 30% by weight Propylene glycol monomethylether acetate (PGMEA) and about 70% by weight Propylene glycol monomethylether (PGME); and
    applying the chemical solution to the surface to remove the silicon-containing material layer.

9. The method of claim 8, wherein the forming of the chemical solution comprises mixing 0.01% to 20% by weight Tetrabutylammonium fluoride (TBAF) with the mixture.

10. The method of claim 8, wherein the halide anions are fluoride F⁻.

11. The method of claim 8, wherein the forming of the chemical solution comprises mixing about 0.01% to about 20% by weight Tetrabutylammonium fluoride (TBAF) with greater than 50% by weight the mixture.

12. A method for removing a silicon-containing material layer comprising:
    forming a silicon-containing material layer over a substrate;
    patterning a photoresist layer over the silicon-containing material layer;
    transferring the pattern from the photoresist layer to the silicon-containing material layer;
    etching the substrate using the patterned silicon-containing material layer as an etching mask; and
    removing the patterned silicon-containing material layer, using a chemical solution having Tetrabutylammonium fluoride (TBAF) and a mixture of Propylene glycol monomethylether (PGME) and Propylene glycol monomethylether acetate (PGMEA), wherein the mixture includes a ratio between PGME and PGMEA of about 7:3.

13. The method of claim 12, wherein the TBAF is about 0.01% to about 20% by weight of the chemical solution and the mixture is greater than 50% by weight of the chemical solution.

14. The method of claim 12, wherein the TBAF is about 0.01% to about 70% by weight of the chemical solution.

15. The method of claim 8, wherein the forming of the chemical solution comprises mixing about 0.1% to about 2% by weight of TBAF with greater than 50% by weight the mixture.

16. The method of claim 8, wherein the forming of the chemical solution comprises mixing about 0.01% to about 70% by weight TBAF with the mixture.

17. The method of claim 8, wherein the silicon-containing material layer contains more than 10% by weight silicon.

18. The method of claim 12, wherein the TBAF is about 0.01% to about 2% by weight of the chemical solution and the mixture is greater than 50% by weight of the chemical solution.

19. The method of claim 12, wherein the chemical solution contains fluoride $F^-$ anions.

20. The method of claim 12, wherein the silicon-containing material layer contains more than 10% by weight silicon.

* * * * *